United States Patent
Leng et al.

(10) Patent No.: US 8,638,529 B1
(45) Date of Patent: Jan. 28, 2014

(54) METHOD AND SYSTEM FOR PROVIDING A MAGNETIC READ TRANSDUCER HAVING A BILAYER MAGNETIC SEED LAYER

(71) Applicant: Western Digital (Fremont), LLC, Fremont, CA (US)

(72) Inventors: Qunwen Leng, Palo Alto, CA (US); Laurence L. Chen, Hayward, CA (US); Yimin Guo, San Jose, CA (US); Yuankai Zheng, Fremont, CA (US); Mahendra Pakala, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/854,828

(22) Filed: Apr. 1, 2013

Related U.S. Application Data

(63) Continuation of application No. 13/297,204, filed on Nov. 15, 2011, now Pat. No. 8,422,176.

(51) Int. Cl.
*G11B 5/39* (2006.01)

(52) U.S. Cl.
USPC .................................. 360/313; 427/131

(58) Field of Classification Search
USPC .................................................. 360/313
See application file for complete search history.

(56) References Cited

U.S. PATENT DOCUMENTS

| | | | |
|---|---|---|---|
| 6,208,492 B1 * | 3/2001 | Pinarbasi | 360/324.11 |
| 6,775,111 B2 * | 8/2004 | Lin et al. | 360/324.11 |
| 8,390,956 B2 * | 3/2013 | Tonooka et al. | 360/135 |
| 8,422,176 B1 * | 4/2013 | Leng et al. | 360/313 |
| 2010/0309580 A1 * | 12/2010 | Tonooka et al. | 360/75 |

* cited by examiner

*Primary Examiner* — Mark Blouin

(57) ABSTRACT

A method and system for providing a magnetic read transducer is described. The magnetic read transducer includes a bilayer magnetic seed layer, an antiferromagnetic (AFM) layer, and a read sensor. The bilayer magnetic seed layer includes a $Ni_{1-x}Fe_x$ layer and a $Ni_{1-y}Fe_y$ layer on the $Ni_{1-x}Fe_x$ layer, where x is at least 0.3 and not more than 1 and where y is not more than 0.19. The AFM layer resides on the bilayer magnetic seed layer. The read sensor is on the AFM layer.

14 Claims, 5 Drawing Sheets

METHOD AND SYSTEM FOR PROVIDING A MAGNETIC READ TRANSDUCER HAVING A BILAYER MAGNETIC SEED LAYER

CROSS REFERENCE TO RELATED APPLICATIONS

This application is a continuation of co-pending U.S. patent application Ser. No. 13/297,204, filed on Nov. 15, 2011, which is hereby incorporated by reference in its entirety.

BACKGROUND

FIG. 1 depicts a portion of a conventional magnetic transducer 10, such as a conventional read transducer, as viewed from the air-bearing surface (ABS). The conventional transducer 10 includes a conventional bottom shield 12, a nonmagnetic underlayer 13, conventional NiFe seed layer 14, conventional nonmagnetic seed layer 16, conventional antiferromagnetic (AFM) layer 18, conventional sensor 20, conventional capping layer 36, and conventional top shield 40. The conventional shields 12 and 40 typically include NiFe and are formed by plating. The conventional underlayer 13 typically includes materials such as Ta, CoFeB, and NiFeB. The conventional nonmagnetic seed layer 16 is typically Ru or NiFeCr.

The conventional sensor 20 is in a current-perpendicular to plane (CPP) configuration. In a CPP configuration, read current is driven generally perpendicular to the plane of the layers of the device, along the z-axis shown. The sensor 20 typically includes a conventional pinned layer 24, a conventional nonmagnetic spacer layer 28, and a conventional reference layer 30. The conventional nonmagnetic spacer layer 28 is typically a tunneling barrier layer. The conventional free layer 34 has a magnetization that is substantially free to change direction in response to an applied magnetic field, for example from a bit being read. The conventional tunneling barrier layer 32 may allow conduction through the sensor 20 via tunneling. The sensor 20 is thus a tunneling magnetoresistive (TMR) sensor. Note that if a conductive spacer layer is used instead of the barrier layer 32, then the sensor 20 is a spin valve. The pinned layer 24 shown is a synthetic antiferromagnet (SAF) includes a first pinned layer 26, a nonmagnetic spacer 28, and a reference layer 30. The reference layer 30 and pinned layer 26 are typically antiferromagnetically coupled. The magnetization(s) of the conventional SAF layer 24 are pinned by the conventional AFM layer 18. More specifically, the pinned layer 26 typically has its magnetization pinned by the conventional AFM layer 18, for example via exchange interaction. The remaining ferromagnetic layer, or reference layer 30, has its magnetization pinned because it is strongly magnetically coupled with the pinned layer 26.

The conventional transducer 10 also includes a conventional NiFe seed layer 14. The NiFe seed layer 14 is approximately fifty percent Ni and fifty percent Fe ($Ni_{0.5}Fe_{0.5}$). The conventional $Ni_{0.5}Fe_{0.5}$ seed layer 14 is magnetic. Such a conventional $Ni_{0.5}Fe_{0.5}$ seed layer 14 improves the thermal stability of the AFM layer 18 grown on the conventional $Ni_{0.5}Fe_{0.5}$ seed layer 14. In particular, as the recording density increases, the distance between the shields 12 and 40 is reduced. The AFM layer 18 has a decreased volume. This decrease in volume may reduce the distribution of blocking temperatures (TbD). The lowering of the TbD reduces the thermal stability of the AFM layer 18 and, therefore, the stability of the SAF pinned layer 24. This would adversely affect performance of the conventional transducer 10. The conventional mechanism for addressing this is the use of the $Ni_{0.5}Fe_{0.5}$ seed layer 14. If the AFM layer 18 is grown on the conventional $Ni_{0.5}Fe_{0.5}$ seed layer 14, then the AFM layer 18 has a larger grain size, a higher anisotropic energy or both. Thus, the thermal stability of the read sensor 20 may be improved even at higher recording densities and smaller shield-to-shield spacing.

Although the conventional sensor 20 functions, there are drawbacks. For example, the conventional $Ni_{0.5}Fe_{0.5}$ seed layer 14 typically has a very large positive magnetostriction. The magnetostriction may adversely affect sensor 20 performance. For example, more noise may be generated. This magnetostriction may also induce an undesired magnetic anisotropy perpendicular to the ABS. The magnetic anisotropy of the $Ni_{0.5}Fe_{0.5}$ seed layer 14, which may be considered to be part of the shield 12, affects the shield 12. The conventional shield 12 may thus become unstable during recording or in the presence of external stray fields. In addition, the conventional $Ni_{0.5}Fe_{0.5}$ seed layer 14 may be overmilled at its sides. If this occurs, the relatively high magnetization of the conventional $Ni_{0.5}Fe_{0.5}$ seed layer 14 may weaken the effect of hard bias layer (not shown). As a result, the free layer response amplitude, asymmetry, and noise are adversely affected. Thus, the conventional read transducer 10 may not function as desired at higher recording densities.

Accordingly, what is needed is a system and method for providing a read transducer having improved performance at higher densities.

BRIEF SUMMARY OF THE INVENTION

A method and system for providing a magnetic read transducer is described. The magnetic read transducer includes a bilayer magnetic seed layer, an antiferromagnetic (AFM) layer, and a read sensor. The bilayer magnetic seed layer includes a $Ni_{1-x}Fe_x$ layer and a $Ni_{1-y}Fe_y$ layer on the $Ni_{1-x}Fe_x$ layer, where x is at least 0.3 and not more than 1 and where y is not more than 0.19. The AFM layer resides on the bilayer magnetic seed layer. The read sensor is on the AFM layer.

DETAILED DESCRIPTION OF THE PREFERRED EMBODIMENTS

Figure 1:
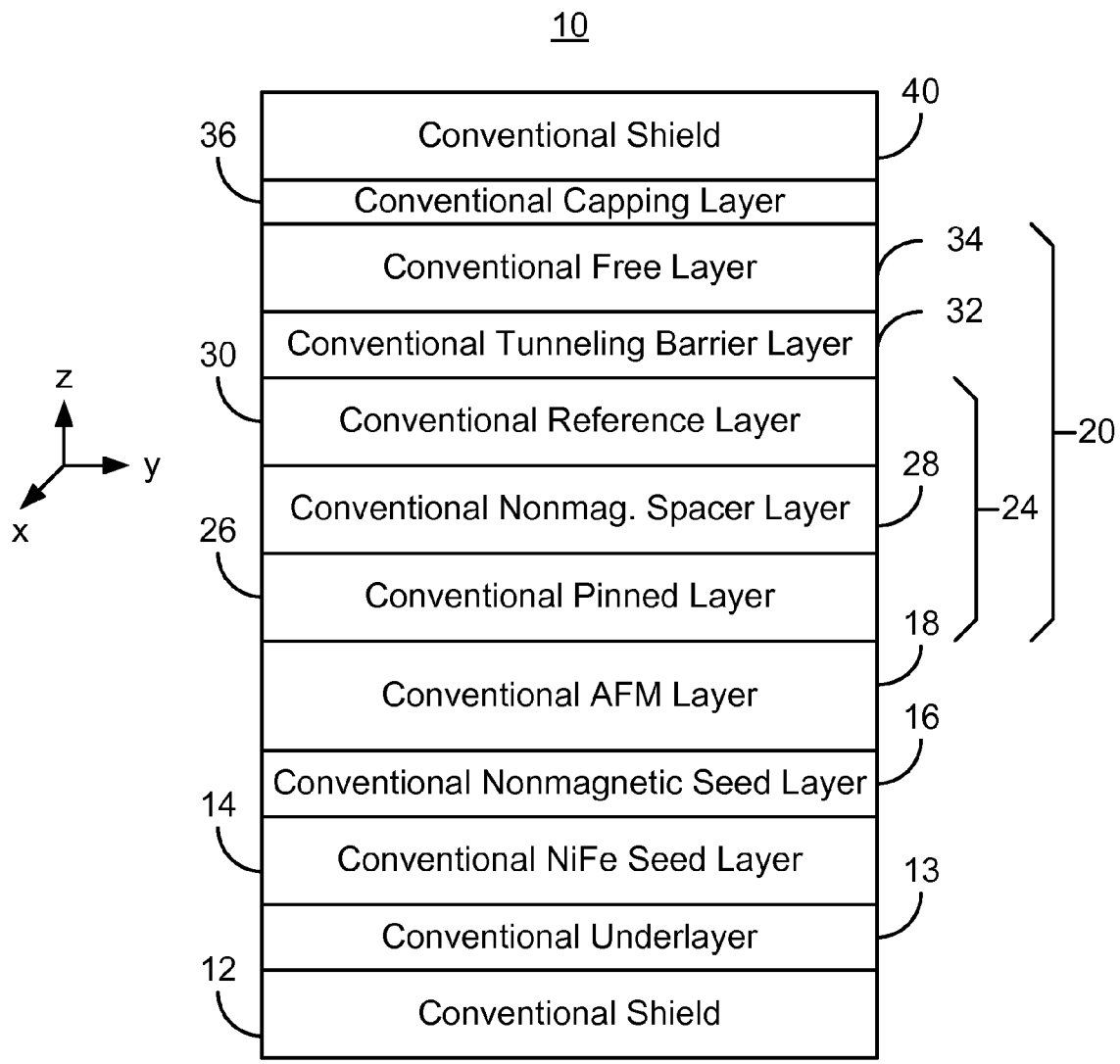
FIG. 1 is a diagram depicting an ABS view of a portion of a conventional transducer including a conventional sensor.
Figure 2:
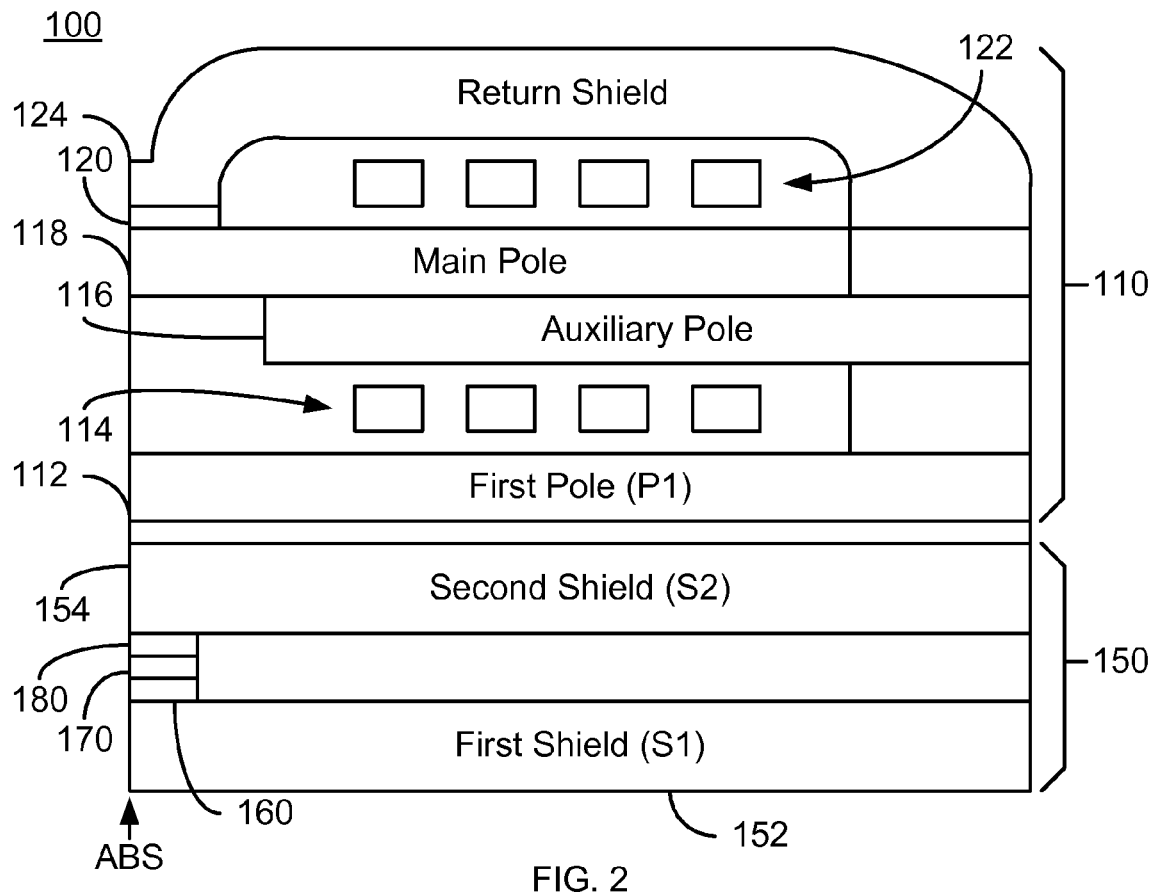
FIG. 2 depicts an exemplary embodiment of a head including an exemplary embodiment of a transducer.

FIG. 2 depicts a magnetic head 100. FIG. 2 is not to scale and not all components of the magnetic head 100 are shown. The magnetic head 100 is a merged head that includes a magnetic write transducer 110 and a magnetic read transducer 150. In other embodiments, the read transducer 150 and write transducer 110 may also be in separate heads. The magnetic head 100 resides on a slider and is typically one of many magnetic heads in a disk drive and used to write to and read from a media (not shown). The write transducer 110 includes a first pole 112, auxiliary pole 116, main pole 118, write gap 120, coils 114 and 122, and return shield 124. However, in another embodiment, the write transducer 110 includes other and/or different components. In addition, one or more portions of the write transducer 110 might be omitted in various embodiments.

The read transducer 150 includes shields 152 and 154, bilayer magnetic seed layer 160, pinning layer 170, and sensor 180. The sensor 180 may be used to read data from a media (not shown). The shields 152 and 154 may be a soft magnetic material, such as NiFe. The shields 152 and 154 magnetically isolate the sensor 180 from bits not being read during operation of the transducer 150. The sensor 180 resides on the pinning layer 170.

The pinning layer 170 may be used to fix, or pin, the magnetization of a layer in the sensor 180, such as a pinned layer (not shown in FIG. 2). The pinning layer 170 may be an AFM layer. The pinning layer 170 is on the bilayer magnetic seed layer 160. In some embodiments, a nonmagnetic seed layer (not shown) resides between the bilayer magnetic seed layer 160 and the pinning layer 170.

The bilayer magnetic seed layer 160 includes a $Ni_{1-x}Fe_x$ layer and a $Ni_{1-y}Fe_y$ layer on the $Ni_{1-x}Fe_x$ layer, where x is at least 0.3 and not more than 1 and where y is not more than 0.19. In some embodiments, x is at least 0.45 and not more than 0.55. In some embodiments, y is at least 0.05 and not more than 0.15. The $Ni_{1-x}Fe_x$ layer is between the $Ni_{1-y}Fe_y$ layer and the shield 152. Although described in terms of two separate layers, in some embodiments, the bilayer magnetic seed layer 160 may not contain separate layers. Instead, the $Ni_{1-x}Fe_x$ layer and the $Ni_{1-y}Fe_y$ layer may be formed by a gradient in concentration between the edge closest to the shield 152 and the edge of the bilayer magnetic seed layer 160 closest to the pinning layer 170. However, in other embodiments, there is a sharp interface between the $Ni_{1-x}Fe_x$ layer and the $Ni_{1-y}Fe_y$ layer. In addition, the bilayer magnetic seed 160 includes at least two NiFe layers having the concentrations described above. In some embodiments, the bilayer magnetic seed layer 160 may include additional layer(s) having intermediate concentrations. In some embodiments, the $Ni_{1-x}Fe_x$ layer has a thickness of at least ten Angstroms and not more than five hundred Angstroms.

Use of the bilayer magnetic seed layer 160 may improve performance of the transducer 150 and thus the head 100. The $Ni_{1-x}Fe_x$ layer has a higher concentration of Fe. The higher concentration of Fe results in a higher TbD and increases the coercivity of a pinned layer (not shown) in the sensor 160. As a result, the stability of the sensor 160 may be improved. The $Ni_{1-y}Fe_y$ layer has a lower concentration of Fe. The $Ni_{1-y}Fe_y$ layer thus has a lower magnetic moment than the $Ni_{1-x}Fe_x$ layer. As a result, issues due to a high moment of the magnetic seed layer 160 such as issues due to overmilling may be reduced. In addition, the $Ni_{1-y}Fe_y$ layer may have magnetostriction opposite to that of the $Ni_{1-x}Fe_x$ layer. For example, the $Ni_{1-y}Fe_y$ layer may have negative magnetostriction, while the $Ni_{1-x}Fe_x$ layer has a positive magnetostriction. The total magnetostriction of the bilayer magnetic seed layer 160 may thus be reduced or brought to zero by balancing the magnetostrictions. Thus, the bilayer magnetic seed layer 160 may be less likely to induce unwanted anisotropies, improving the stability of the shield 152.

Figure 3:
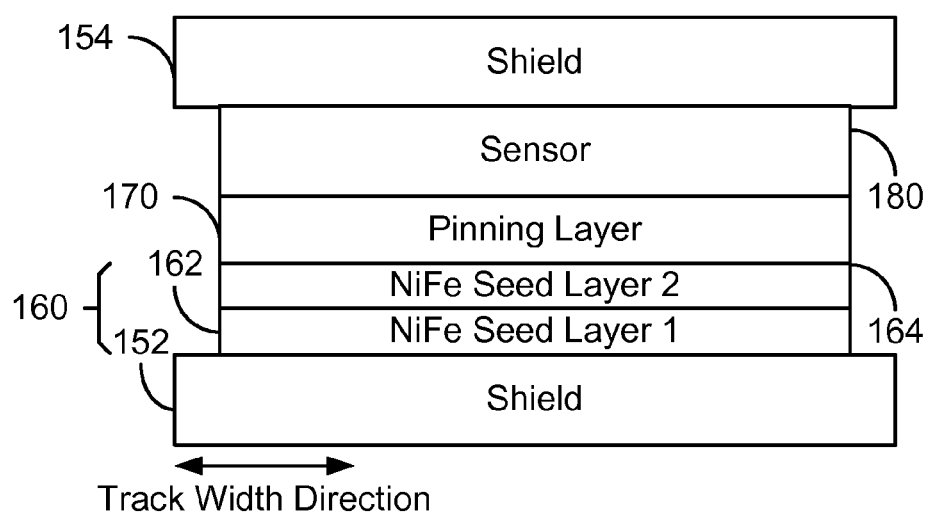
FIG. 3 depicts an ABS view of a portion of an exemplary embodiment of a read transducer.

FIG. 3 depicts an exemplary embodiment of the read transducer 150 as used in the magnetic recording head 100. For clarity, FIG. 3 is not to scale. The transducer 150 is also described in the context of particular layers. However, in some embodiments, such layers may include sub-layer(s). The read transducer 150 is shown in a CPP configuration. Thus, sensor 180 is electrically connected to the shields 152 and 154. However, in another embodiment, a gap may exist between the sensor 180 and the shields 152 and/or 154. Further, a configuration other than CPP might be used. The read transducer 150 is also described in the context of particular layers. However, in some embodiments, such layers may include sub-layer(s).

The read transducer 150 includes shields 152 and 154, bilayer magnetic seed layer 160, pinning layer 170, and sensor 180 analogous to those depicted in FIG. 2. The pinning layer 170 may be an AFM layer. For example, the pinning layer 170 may be an IrMn layer. The pinning layer 170 is on the bilayer magnetic seed layer 160. In some embodiments, a nonmagnetic seed layer (not shown) resides between the bilayer magnetic seed layer 160 and the pinning layer 170. For example, such a nonmagnetic seed layer may include at least one of Ru, NiFeZ, and NiZ, where Z is at least one of Cr, Zr, Rh, and Ta.

The bilayer magnetic seed layer 160 includes a $Ni_{1-x}Fe_x$ layer (labeled NiFe seed layer 1 in FIG. 3) 162 and a $Ni_{1-y}Fe_y$ layer 164 (labeled NiFe seed layer 2 in FIG. 3) on the $Ni_{1-x}Fe_x$ layer 162, where x is at least 0.3 and not more than 1 and where y is not more than 0.19. In some embodiments, x is at least 0.45 and not more than 0.55. In some embodiments, y is at least 0.05 and not more than 0.15. The $Ni_{1-x}Fe_x$ layer 162 is thus between the $Ni_{1-y}Fe_y$ layer 164 and the shield 152. In some embodiments, the $Ni_{1-x}Fe_x$ layer 162 has a thickness of at least ten Angstroms and not more than one hundred Angstroms. In some such embodiments, the thickness of the $Ni_{1-x}Fe_x$ 162 layer is at least fifteen Angstroms and not more than fifty Angstroms. In some embodiments, the $Ni_{1-y}Fe_y$ layer 164 has a thickness of at least ten Angstroms and not more than five hundred Angstroms. In some embodiments, the layers 162 and 164 are formed by changing the concentration of Ni and Fe throughout the layer 160. In some embodiments, the bilayer magnetic seed layer 160 is grown on another magnetic seed layer (not shown in FIG. 3).

The transducer depicted in FIG. 3 shares the benefits of the transducer 150 depicted in FIG. 2. The combination of the layers 162 and 164 in the bilayer magnetic seed layer 160 may result in improved thermal stability of the sensor 180. More specifically, the desired structure of the pinning layer 170 may be achieved for lower volumes of the pinning layer 170 and lower shield-to-shield spacing. Issues due to magnetostriction of the bilayer magnetic seed layer 160 may also be reduced or eliminated. As a result, the stability of the sensor 160 and shield 152 may be improved. Consequently, performance of the magnetic transducer 150 may be improved.

Figure 4:
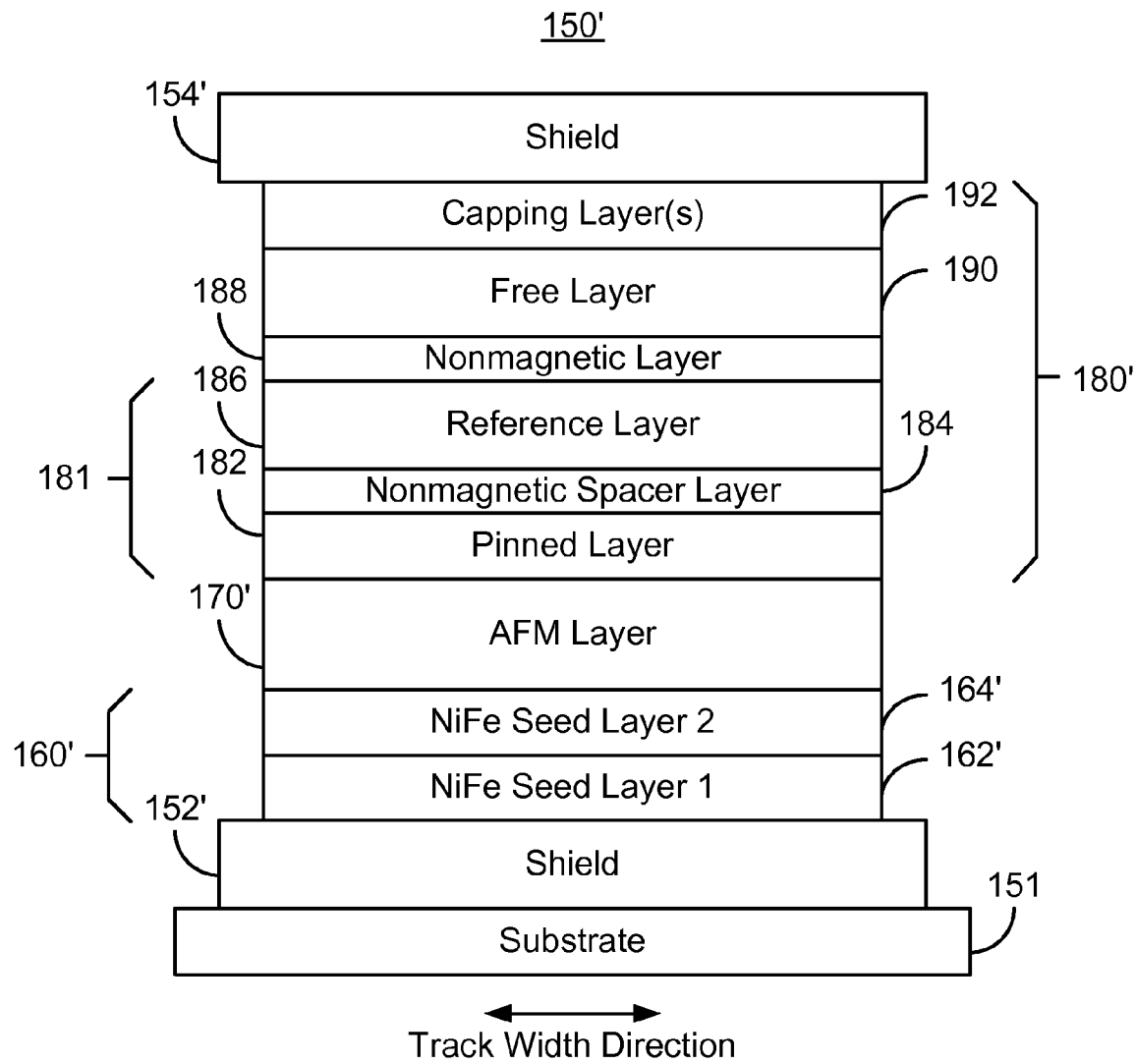
FIG. 4 depicts an ABS view of a portion of another exemplary embodiment of a read transducer.

FIG. 4 depicts another exemplary embodiment of a read transducer 150' including a bilayer magnetic seed layer 160'. For clarity, FIG. 4 is not to scale. The transducer 150' is also described in the context of particular layers. However, in some embodiments, such layers may include sub-layer(s). The read transducer 150' is shown in a CPP configuration. Thus, sensor 180' is electrically connected to the shields 152' and 154'. However, in another embodiment, a gap may exist between the sensor 180' and the shields 152' and/or 154'. A configuration other than CPP may also be used. The read transducer 150' is also described in the context of particular layers. However, in some embodiments, such layers may include sub-layer(s).

Portions of the transducer 150' are analogous to those of the head 100 and transducer 150 shown in FIGS. 2-3. Such analogous structures are labeled similarly. The transducer 150' thus includes shields 152' and 154', bilayer magnetic seed layer 160', pinning layer 170', and sensor 180' that are analogous to the shields 152 and 154, bilayer magnetic seed layer 160, pinning layer 170, and sensor 180, respectively. However, the pinning layer 170' is expressly indicated to be an AFM layer 170'. For example, the AFM layer 170' may be an IrMn or other analogous layer. In the embodiment shown, the AFM layer 170' is grown on the bilayer magnetic seed layer 160'. However, in other embodiments, an additional seed layer may be used between the layers 160' and 170'.

The sensor 180' includes a pinned layer 181, a nonmagnetic layer 188, a free layer 190, and an optional capping layer 192. The capping layer 192 is nonmagnetic and may include materials such as Ta. The pinned layer 181 shown is a SAF including ferromagnetic pinned layer 182, nonmagnetic spacer layer 184, and ferromagnetic reference layer 186. The pinned layer 182 has its magnetization fixed, or pinned, by the AFM layer 170'. The reference layer 186 is magnetically coupled to the pinned layer 182 and has its magnetization fixed through this interaction. In other embodiments, the pinned layer 181 may have another structure, such as a single layer or a multilayer. The free layer 190 includes one or more ferromagnetic layers (not separately shown in FIG. 4) and is the sensor layer for the sensor 180'. In some embodiments, the free layer 190 may also include nonmagnetic layers. The nonmagnetic layer 188 separates the free layer 190 from the pinned layer 181. The nonmagnetic layer 188 may also be desired to support a large magnetoresistance for the sensor 180'. In some embodiments, the nonmagnetic layer 188 is an insulating, tunneling barrier layer, such as crystalline MgO. In other embodiments, the nonmagnetic layer 188 may be conductive and/or have another structure.

The bilayer magnetic seed layer 160' includes a $Ni_{1-x}Fe_x$ layer (labeled NiFe seed layer 1 in FIG. 4) 162' and a $Ni_{1-y}Fe_y$ layer 164' (labeled NiFe seed layer 2 in FIG. 4) on the $Ni_{1-x}Fe_x$ layer 162', where x is at least 0.3 and not more than 1 and where y is not more than 0.19. In some embodiments, x is at least 0.45 and not more than 0.55. In some embodiments, y is at least 0.05 and not more than 0.15. The $Ni_{1-x}Fe_x$ layer 162' is between the $Ni_{1-y}Fe_y$ layer 164' and the shield 152'. In some embodiments, the $Ni_{1-x}Fe_x$ layer 162' has a thickness of at least ten Angstroms and not more than one hundred Angstroms. In some such embodiments, the thickness of the $Ni_{1-x}Fe_x$ 162' layer is at least fifteen Angstroms and not more than fifty Angstroms. In some embodiments, the $Ni_{1-y}Fe_y$ layer 164' has a thickness of at least ten Angstroms and not more than five hundred Angstroms. In some embodiments, the layers 162' and 164' are formed by changing the concentration of Ni and Fe throughout the layer 160'. In some embodiments, the bilayer magnetic seed layer 160' is grown on another magnetic seed layer (not shown in FIG. 4).

The transducer 150' depicted in FIG. 4 shares the benefits of the transducer 150 depicted in FIGS. 2-3. The combination of the layers 162' and 164' in the bilayer magnetic seed layer 160' may result in improved thermal stability of the sensor 180'. More specifically, the desired structure of the pinning layer 170' may be achieved for lower shield-too-shield spacing. Issues due to magnetostriction of the bilayer magnetic seed layer 160' may also be reduced or eliminated. As a result, the stability of the sensor 160' and shield 152' may be improved. Consequently, performance of the magnetic transducer 150' may be improved.

Figure 5:
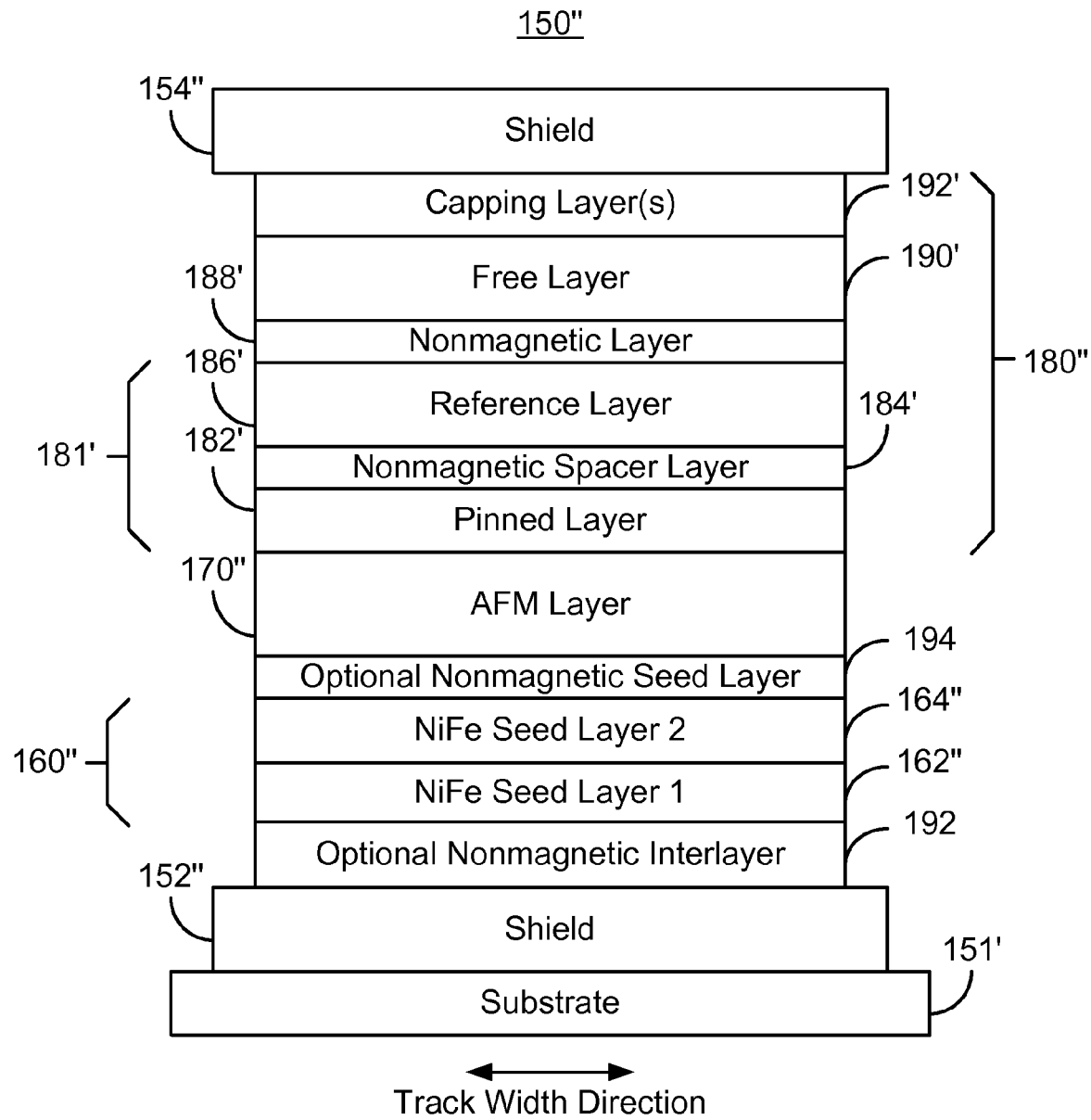
FIG. 5 depicts an ABS view of a portion of another exemplary embodiment of a read transducer.

FIG. 5 depicts an ABS view of another exemplary embodiment of a read transducer 150" including a bilayer magnetic seed layer 160". For clarity, FIG. 5 is not to scale. The transducer 150" is also described in the context of particular layers. However, in some embodiments, such layers may include sub-layer(s). The read transducer 150" is shown in a CPP configuration. Thus, sensor 180' is electrically connected to the shields 152" and 154". However, in another embodiment, a gap may exist between the sensor 180" and the shields 152" and/or 154". A configuration other than CPP may also be used. The read transducer 150" is also described in the context of particular layers. However, in some embodiments, such layers may include sub-layer(s).

Portions of the transducer 150" are analogous to those of the head 100 and transducers 150/150' shown in FIGS. 2-4. Such analogous structures are labeled similarly. The transducer 150" thus includes shields 152" and 154", bilayer magnetic seed layer 160", pinning layer 170", and sensor 180" that are analogous to the shields 152/152' and 154/154', bilayer magnetic seed layer 160/150', pinning layer 170/170', and sensor 180/180', respectively. The pinning layer 170" is expressly indicated to be an AFM layer 170". For example, the AFM layer 170" may be an IrMn or other analogous layer. The sensor 180" includes a pinned layer 181' having layers 182', 184', and 186', a nonmagnetic layer 188', a free layer 190', and an optional capping layer 192' analogous to the pinned layer 181 having layers 182, 184, and 186, the nonmagnetic layer 188, the free layer 190, and the optional capping layer 192, respectively.

The bilayer magnetic seed layer 160" includes a $Ni_{1-x}Fe_x$ layer (labeled NiFe seed layer 1 in FIG. 5) 162" and a $Ni_{1-y}Fe_y$ layer 164" (labeled NiFe seed layer 2 in FIG. 5) on the $Ni_{1-x}Fe_x$ layer 162", where x is at least 0.3 and not more than 1 and where y is not more than 0.19. In some embodiments, x is at least 0.45 and not more than 0.55. In some embodiments, y is at least 0.05 and not more than 0.15. The $Ni_{1-x}Fe_x$ layer 162" is between the $Ni_{1-y}Fe_y$ layer 164' and the shield 152". The structure, geometry, and function of the $Ni_{1-x}Fe_x$ layer 162" and the $Ni_{1-y}Fe_y$ layer 164" are analogous to that of the $Ni_{1-x}Fe_x$ layer 162/162' and the $Ni_{1-y}Fe_y$ layer 164/164'.

In addition, the transducer 150" includes optional interlayer 192. For example, the interlayer 192 may be CoFeB and/or NiFeB. In some embodiments, the interlayer 192 is magnetic. In other embodiments, however, the interlayer 192 is nonmagnetic. The transducer 150" also includes optional nonmagnetic seed layer 194. The nonmagnetic seed layer 194 may include material such as Ru, and NiZ, where Z is at least one of Cr, Zr, Rh, and Ta. In some embodiments, the nonmagnetic seed layer 194 may be used to break or reduce the magnetic coupling between the bilayer magnetic seed layer 160" and the AFM layer 170".

The transducer 150" depicted in FIG. 5 shares the benefits of the transducers 150/150'/150" depicted in FIGS. 2-4. The combination of the layers 162" and 164" in the bilayer magnetic seed layer 160" may result in improved thermal stability of the sensor 180". More specifically, the desired structure of the pinning layer 170" may be achieved for lower shield-too-shield spacing. Issues due to magnetostriction of the bilayer magnetic seed layer 160' may also be reduced or eliminated. As a result, the stability of the sensor 160" and shield 152" may be improved. Consequently, performance of the magnetic transducer 150" may be improved.

Figure 6:
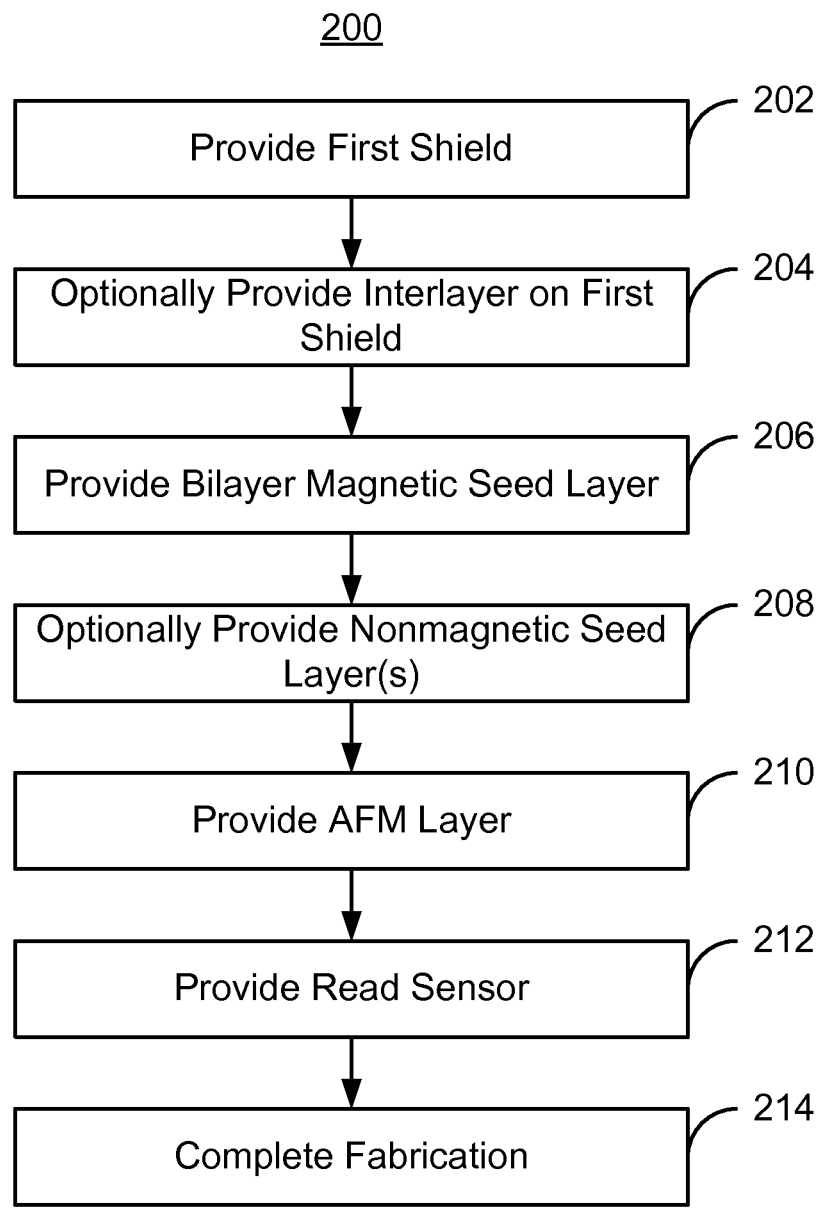
FIG. 6 depicts an exemplary embodiment of a method of forming an exemplary embodiment of a read transducer.

FIG. 6 depicts an exemplary embodiment of a method 200 of forming an exemplary embodiment of a read transducer including a bilayer magnetic seed layer. For simplicity, some steps may be omitted, combined, and/or interleaved. The method 200 is described in the context of the transducer 150". However, the method 200 may be used for other transducers. The method 200 also may commence after formation of other structures of the read and/or write transducer. The method 200 is also described in the context of providing a single transducer 150". However, the method 200 may be used to fabricate multiple structures at substantially the same time. The method 200 and structures such as the transducers 150/

150'/150"/150'" are also described in the context of particular layers. However, in some embodiments, such layers may include sub-layer(s).

The first shield 152" is provided, via step 202. In some embodiments, the first shield 152" is plated on the substrate 151". However, in other embodiments, first shield 152" is deposited in another manner and/or on another structure. The interlayer 192 may optionally be provided on the first shield, via step 204. The bilayer magnetic seed layer 160" is deposited in step 206. In some embodiments, step 206 includes depositing two separate layers 162" and 164". In other embodiments, the layer 162" and 164" are provided by changing the concentration of the Ni and Fe across the bilayer magnetic seed layer 160". The nonmagnetic seed layer 194 may optionally be provided, via step 208. The AFM pinning layer 170" and read sensor 180" are provided via steps 210 and 212, respectively. In some embodiments, steps 210 and 212 include depositing the layers 170", 182', 184', 186', 188', 190', and 192', and then defining the AFM 170" and read sensor 180" in the track width and stripe height (perpendicular to the ABS) directions. Fabrication of the transducer 150" may then be completed, via step 214. For example, hard bias or other analogous structures may be provided. The top shield 154" may also be provided.

Using the method 200 fabrication of the transducers 150, 150', and/or 150", as well as head 100 may be completed. Thus, the benefits of the transducers 150, 150', and/or 150" may be achieved.

We claim:

1. A method for providing a magnetic read transducer comprising:
   providing a bilayer magnetic seed layer including a $Ni_{1-x}Fe_x$ layer and a $Ni_{1-y}Fe_y$ layer on and sharing an interface with the $Ni_{1-x}Fe_x$ layer and, where x is at least 0.3 and not more than 1 and where y is not more than 0.19;
   providing an antiferromagnetic (AFM) layer residing on the bilayer magnetic seed layer;
   a read sensor on the AFM layer.

2. The method of claim 1 further comprising:
   providing a nonmagnetic seed layer on the bilayer magnetic seed layer, the AFM layer residing on the nonmagnetic seed layer.

3. The method of claim 2 wherein the nonmagnetic seed layer includes at least one of Ru, NiFeZ, and NiZ, where Z is at least one of Cr, Zr, Rh, and Ta.

4. The method of claim 1 wherein x is at least 0.45 and not more than 0.55.

5. The method of claim 1 wherein y is at least 0.05 and not more than 0.15.

6. The method of claim 1 wherein the $Ni_{1-x}Fe_x$ layer has a thickness of at least ten Angstroms and not more than one hundred Angstroms.

7. The method of claim 6 wherein the thickness is at least fifteen Angstroms and not more than fifty Angstroms.

8. The method of claim 1 wherein the $Ni_{1-y}Fe_y$ layer has a thickness of at least ten Angstroms and not more than five hundred Angstroms.

9. The method of claim 8 wherein the thickness is at least fifty Angstroms and not more than two hundred.

10. The method of claim 1 wherein the read sensor includes a pinned layer on the AFM layer, a free layer, and a nonmagnetic spacer layer between the pinned layer and the free layer.

11. The method of claim 10 further comprising a first shield and a second shield, the bilayer magnetic seed layer, the AFM layer, and the read sensor residing between the first shield and the second shield.

12. The method of claim 11 further comprising:
    providing an interlayer between the first shield and the bilayer magnetic seed layer, the interlayer including at least one of CoFeB and NiFeB.

13. A method for providing a magnetic read transducer comprising:
    providing a first shield;
    providing an interlayer including at least one of CoFeB and NiFeB on the first shield;
    providing a bilayer magnetic seed layer on the interlayer, the bilayer magnetic seed layer including a $Ni_{1-x}Fe_x$ layer having a first thickness and a $Ni_{1-y}Fe_y$ layer on the $Ni_{1-x}Fe_x$ layer, the $Ni_{1-y}Fe_y$ layer sharing an interface with the $Ni_{1-x}Fe_x$ layer the $Ni_{1-y}Fe_y$ layer having a second thickness, where x is at least 0.45 and not more than 0.55 and where y is at least 0.05 and not more than 0.15, the first thickness being fifteen Angstroms and not more fifty Angstroms, the second thickness being at least fifty Angstroms and not more than two hundred Angstroms;
    providing a nonmagnetic seed layer on the bilayer magnetic seed layer, the nonmagnetic seed layer including at least one of Ru, NiFeZ, and NiZ, where Z is at least one of Cr, Zr, Rh, and Ta;
    providing an antiferromagnetic (AFM) layer residing on the nonmagnetic seed layer;
    providing a read sensor on the AFM layer, the read sensor including a pinned layer on the AFM layer, a free layer, and a nonmagnetic spacer layer between the pinned layer and the free layer, the pinned layer being a synthetic antiferromagnetic layer including a first magnetic layer, a second magnetic layer, and a nonmagnetic layer between the first magnetic layer and the second magnetic layer, the nonmagnetic spacer layer being a tunneling barrier layer;
    providing a capping layer on the read sensor; and
    providing a second shield on the capping layer.

14. A method for providing a magnetic recording disk drive comprising:
    providing a slider; and
    providing a magnetic read transducer on the slider, the magnetic read transducer including a bilayer magnetic seed layer, an antiferromagnetic (AFM) layer on the bilayer magnetic seed layer and a read sensor on the AFM layer, the bilayer magnetic seed layer including a $Ni_{1-x}Fe_x$ layer and a $Ni_{1-y}Fe_y$ layer on and sharing an interface with the $Ni_{1-x}Fe_x$ layer and, where x is at least 0.3 and not more than 1 and where y is not more than 0.19.

* * * * *